(12) United States Patent
Chung et al.

(10) Patent No.: US 6,937,463 B2
(45) Date of Patent: Aug. 30, 2005

(54) SUPPORT HAVING ADJUSTABLE WIDTH

(75) Inventors: Ming Tsai Chung, Hsinchu (TW); Hsu-shih Huang, Hsinchu (TW)

(73) Assignee: D-Link Corporation, Hsinchu (TW)

( * ) Notice: Subject to any disclaimer, the term of this patent is extended or adjusted under 35 U.S.C. 154(b) by 39 days.

(21) Appl. No.: 10/760,372

(22) Filed: Jan. 21, 2004

(65) Prior Publication Data

US 2005/0157453 A1   Jul. 21, 2005

(51) Int. Cl.[7] .............................................. G06F 1/16
(52) U.S. Cl. ........................ 361/679; 29/828; 360/73.2
(58) Field of Search ............................... 361/679–687, 361/724–727, 814, 818; 312/223.1–223.6; 174/52.1; 360/73.02; 29/828–830

(56) References Cited

U.S. PATENT DOCUMENTS

| | | | |
|---|---|---|---|
| 6,738,264 B2 * | 5/2004 | Takagi | 361/814 |
| 6,788,532 B2 * | 9/2004 | Yang et al. | 361/685 |
| 2004/0223296 A1 * | 11/2004 | Hsu | 361/680 |

* cited by examiner

*Primary Examiner*—Hung Van Duong
(74) *Attorney, Agent, or Firm*—Bacon & Thomas PLLC

(57) ABSTRACT

The present invention is to provide a support for holding a housing of an electronic device, which comprises a flat, elongate base having a recess at either end, and two L-shaped members each hingedly attached to the mouth of the recess. The L-shaped members are adapted to pivot to fit its horizontal sections in the recesses for defining a first receiving space by two parallel vertical sections thereof and an intermediate portion of the base so that the housing in an upright position is adapted to be disposed in the first receiving space and clamped by the vertical sections.

7 Claims, 5 Drawing Sheets

SUPPORT HAVING ADJUSTABLE WIDTH

FIELD OF THE INVENTION

The present invention relates to a support for keeping an attached device (e.g., electronic device) from slipping on a flat surface (e.g., desk), and more particularly to such a support having adjustable width so as to hold the device in an upright or lying down position. Alternatively, the support is adapted to hold the device on a wall.

BACKGROUND OF THE INVENTION

Conventionally, a plurality of supports are releasably attached to the underside of an electronic device seated on a desk or floor for achieving the purposes of sufficient heat dissipation, easy operation, and preventing the electronic device from directly contacting the desk or floor or saving the occupied space.

Referring to FIGS. 1 and 2, there is shown two well known supports 4 attached to the underside of the housing 5 of an electronic device. The support 4 comprises a flat, elongate base 41, a clamp consisting of two spaced vertical members 42 provided on the base 41, a receiving space 43 defined by the vertical members 42 and the portion of the base 41 between the vertical members 42, and an elongated ridge 40 at the inner surface of either vertical member 42.

A plurality of slots 50 are provided at both the top and the bottom of the housing 5. The ridges 40 of the supports 4 are adapted to insert into the slots 50 so as to secure the supports 4 to the housing 5. Accordingly, the housing 5 is able to stably stand on a flat surface (e.g., desk) with the supports 4 being rested thereon. Moreover, it has the advantages of saving the occupied space of the electronic device and maintaining good heat dissipation thereof.

However, attaching the supports 4 to the underside of the housing 5 can only achieve the purpose of stably placing the housing 5 on the desk. This is unsatisfactory for the purpose of seeking an all-in-one design of the support by vast consumers. Thus, it is desirable to provide a novel support having adjustable width so that it is adapted to hold the housing 5 in an upright or lying down position. Alternatively, the support is adapted to hold the housing 5 on a wall by a simple fastening operation.

SUMMARY OF THE INVENTION

A primary object of the present invention is to provide a support for holding a housing of an electronic device, the support having an adjustable width so that it is adapted to hold the housing in an upright or lying down position. Alternatively, the support is adapted to hold the housing on a wall. The support comprises a flat, elongate base having a recess at either end, and two L-shaped members each hingedly attached to the mouth of the recess. The L-shaped members are adapted to pivot to fit its horizontal sections in the recesses for defining a first receiving space by two parallel vertical sections thereof and an intermediate portion of the base so that the housing in an upright position is adapted to be disposed in the first receiving space and clamped by the vertical sections. Alternatively, the L-shaped members are adapted to pivot until the horizontal sections are flush with the base and are extended from the mouths of the recesses, and each vertical section is upright from a portion thereof joined the horizontal section for defining a second receiving space by the parallel vertical sections, the base, and the horizontal sections so that the housing in a lain position is adapted to be disposed in the second receiving space and clamped by the vertical sections.

The above and other objects, features and advantages of the present invention will become apparent from the following detailed description taken with the accompanying drawings.

DETAILED DESCRIPTION OF THE PREFERRED EMBODIMENTS

Figure 1:
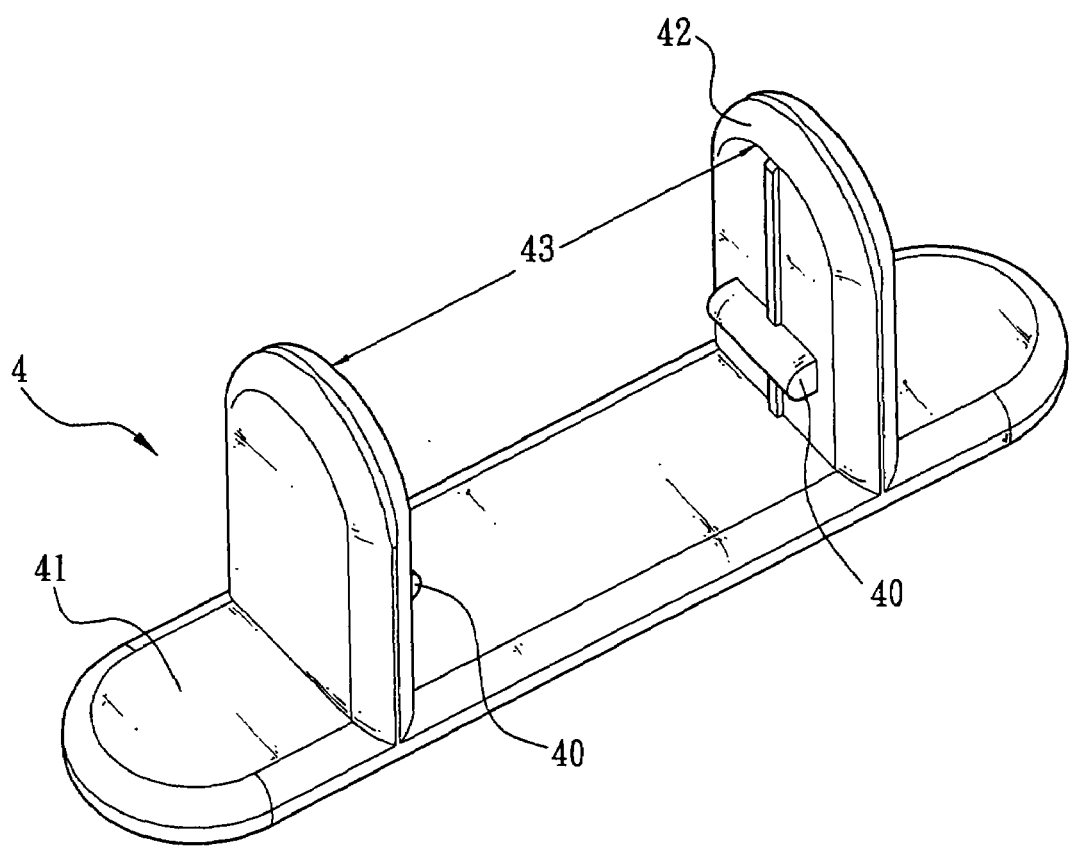
FIG. 1 is a perspective view of a conventional support.
Figure 2:
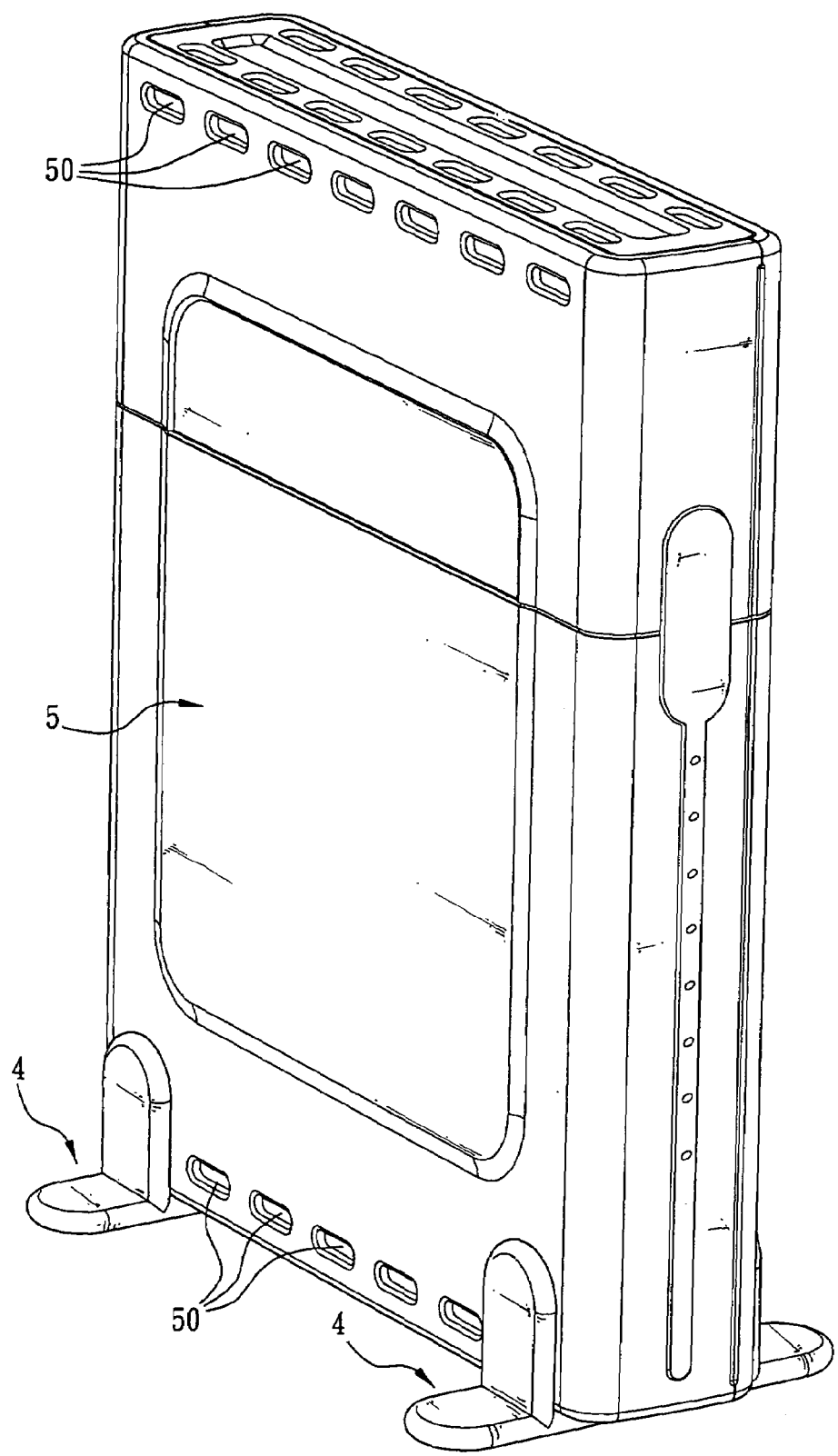
FIG. 2 is a perspective view of the conventional supports attached to the underside of the housing of an electronic device.
Figure 3:
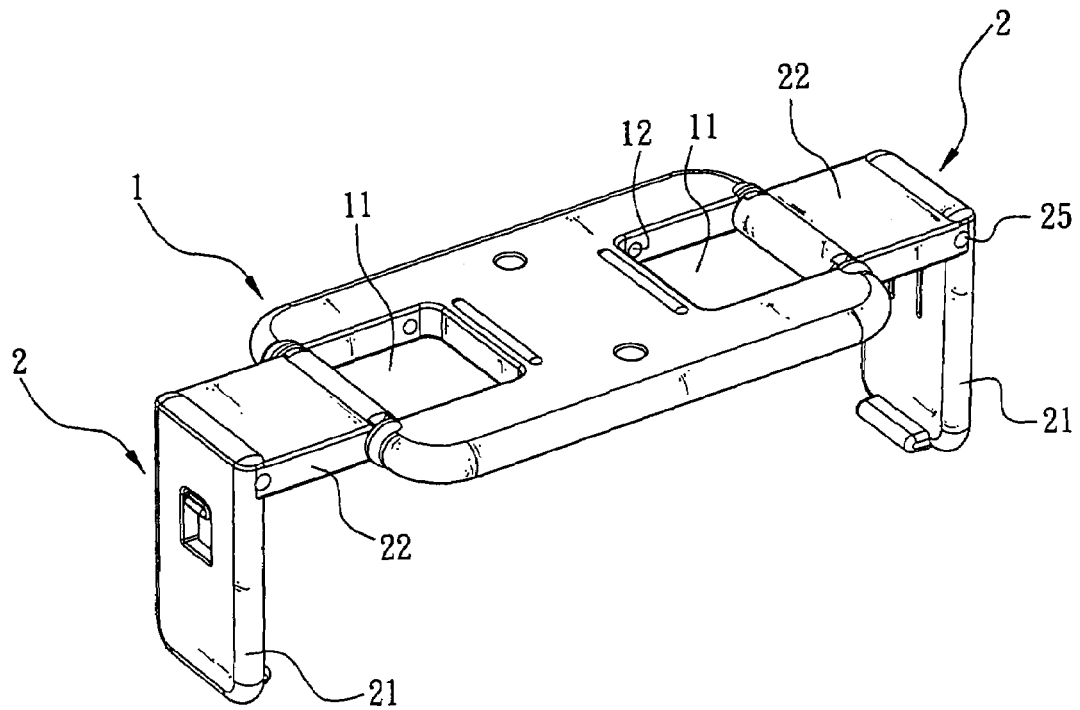
FIG. 3 is a perspective view of a preferred embodiment of support according to the invention, where the support is shown in a first configuration.

Referring to FIG. 3, there is shown a support having adjustable width in accordance with the invention comprising a flat, elongate base 1 having a rectangular recess 11 at about center of either end, and two L-shaped members 2 each hingedly attached to one end of the base 1 proximate the mouth of the recess 11, the L-shaped member 2 comprising a rectangular vertical section 21 and a rectangular horizontal section 22 sized to snugly fit in the recess 11.

Figure 4:
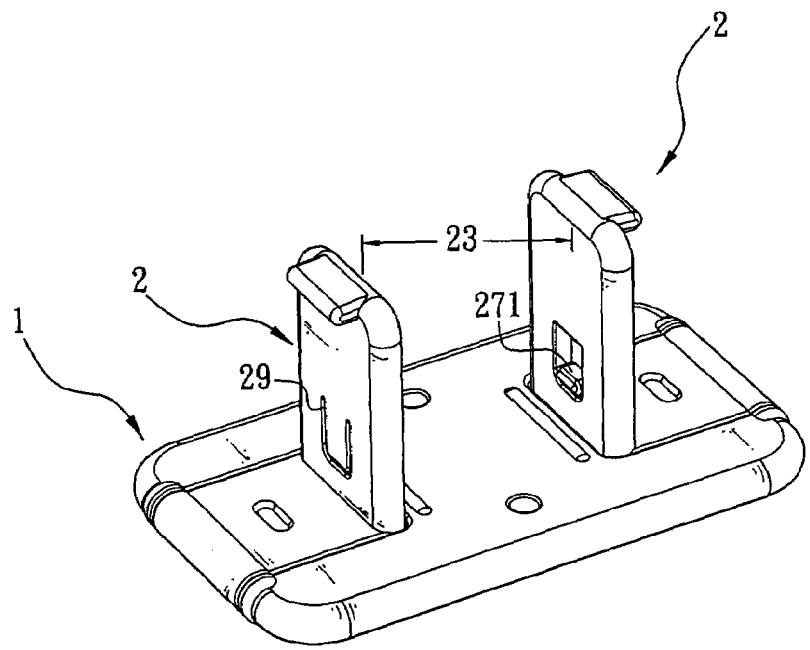
FIG. 4 is a perspective view of the support of the invention shown in a second configuration.
Figure 5:
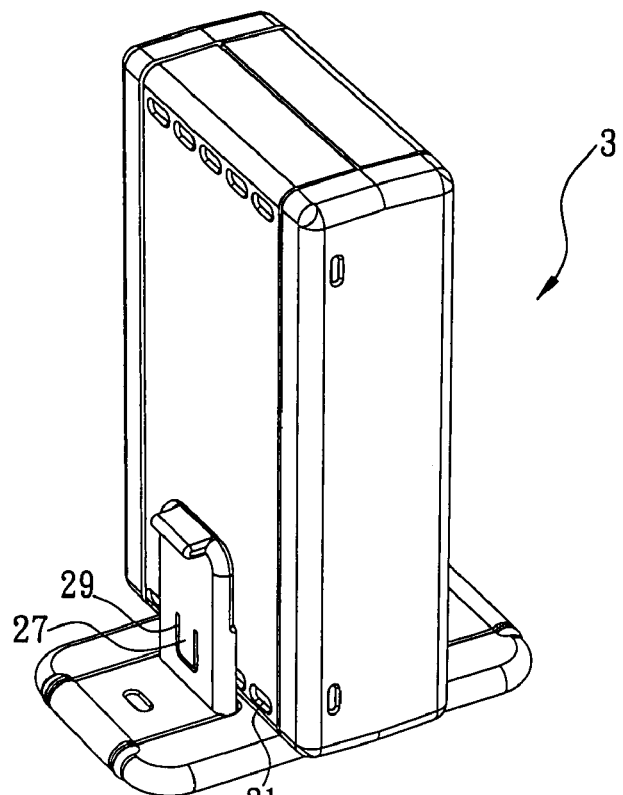
FIG. 5 is a perspective view of the support of the invention attached to the underside of the housing of an electronic device in an upright position.
Figure 6:
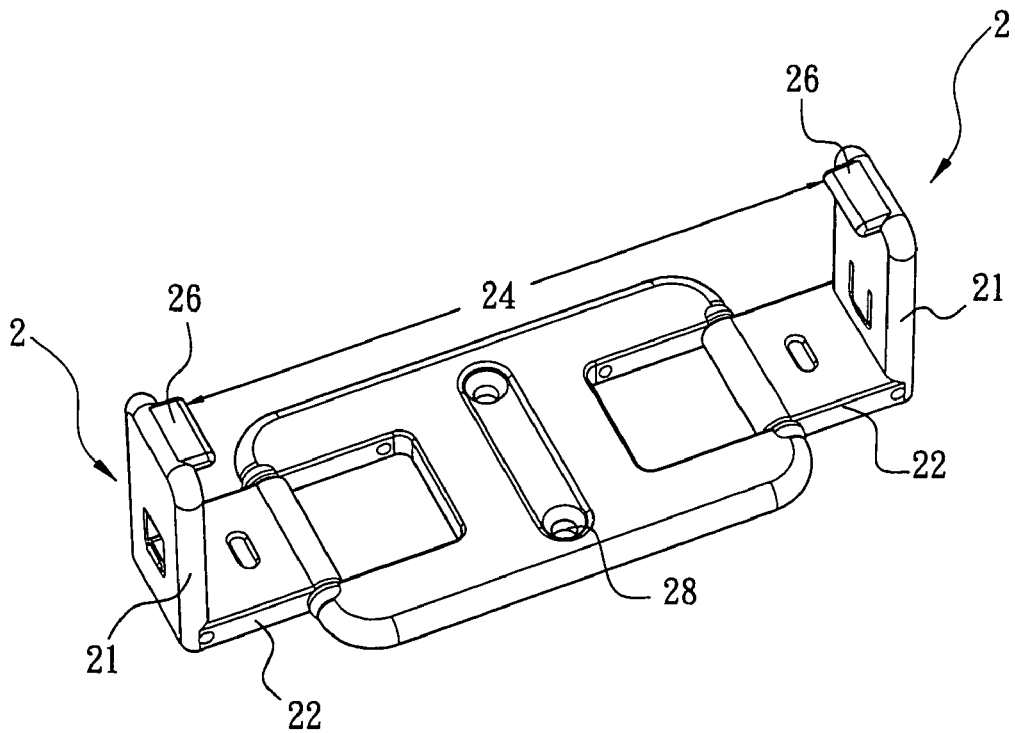
FIG. 6 is another perspective view of the support of the invention shown in FIG. 3.
Figure 7:
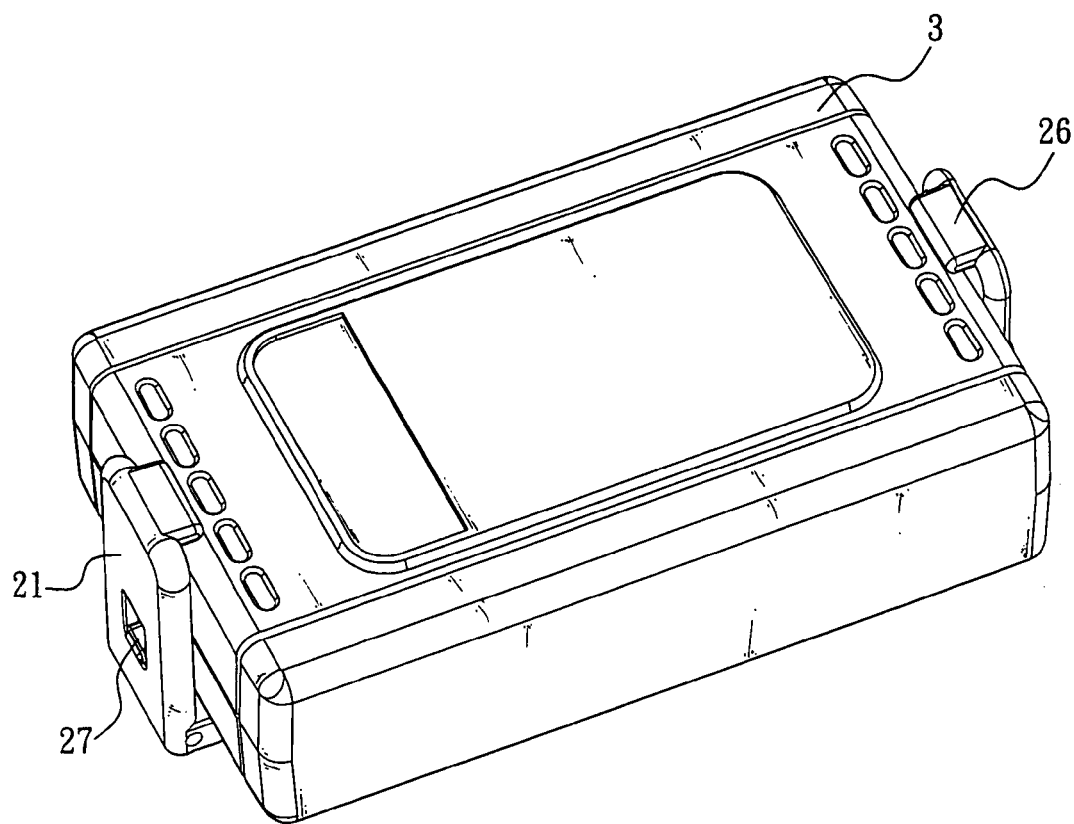
FIG. 7 is a perspective view of the support of the invention attached to the underside of the housing in a lying down position.

Referring to FIG. 4, the L-shaped members 2 have been pivoted to fit the horizontal sections 22 in the recesses 11. A receiving space 23 is defined by the parallel vertical sections 21 and an intermediate portion of the base 1. Referring to FIG. 5, there is shown an upright electronic device having a lower portion of its housing 3 disposed in the receiving space 23 and clamped by the vertical sections 21 of the support rested on a desk. Referring to FIG. 6, the L-shaped members 2 have been pivoted about 180 degrees with respect to the recesses 11 from the position shown in FIG. 4 in which the horizontal sections 22 are flush with the base 1 and are extended from the outer ends of the recesses 11. Also, each vertical section 21 is upright from the joining portion of the horizontal section 22 and itself. Thus, another receiving space 24 is defined by the parallel vertical sections 21, the base 1, and the horizontal sections 22. Referring to FIG. 7, there is shown the lain housing 3 disposed in the receiving space 24 and clamped by the vertical sections 21 of the support rested on the desk.

Referring to FIGS. 3 and 4 again, for providing a reliable fastening of the horizontal section 22 in the recess 11, in the invention a cavity 25 is provided at either end of the joining portion of the horizontal section 22 and the vertical section 21 and a mated projection 12 is provided at either side of the recess 11. Alternatively, a projection 12 is provided at either end of the joining portion of the horizontal section 22 and the vertical section 21 and a mated cavity 25 is provided at either side of the recess 11.

Referring to FIGS. 4 and 5 again, a U-shaped gap 29 is provided at about intermediate portion of an outer surface of the vertical section 21, and a flexible member 27 is defined by the U-shaped gap 29, the flexible member 27 having a latch 271 on an inner surface of the vertical section 21. Also, a plurality of slots 31 are provided at either side of each of the top and the bottom of the housing 3. The latches 271 are adapted to insert into the slots 31 so as to secure the housing 3 to the support rested on the desk.

Referring to FIGS. 6 and 7 again, in the invention a catch 26 is provided at about center of the open end of the vertical section 21 distal from the horizontal section 22. The catch 26 is substantially parallel to the horizontal section 22. In a case of the L-shaped members 2 pivoted to a position in which the horizontal sections 22 are flush with the base 1 and are extended from the outer ends of the recesses 11, and another receiving space 24 is formed, the lain housing 3 is disposed in the receiving space 24 and clamped by the vertical sections 21 with the catches 26 being snapped on the housing 3 for fastening. Moreover, at least one opening (two are shown) 28 is provided at about center of the base 1. A screw, nail, or hook is adapted to driven through the opening 28 so as to fasten the base 1 at a wall or desk.

While the invention has been described by means of specific embodiments, numerous modifications and variations could be made thereto by those skilled in the art without departing from the scope and spirit of the invention set forth in the claims.

What is claimed is:

1. A support for holding a housing of an electronic device, the support having an adjustable width, comprising:
   a flat, elongate base having a recess at about center of either end; and
   two L-shaped members each hingedly attached to one end of the base proximate the mouth of the recess, the L-shaped member comprising a vertical section and a horizontal section sized to snugly fit in the recess,
   wherein the L-shaped members are adapted to pivot to fit the horizontal sections in the recesses for defining a first receiving space by the parallel vertical sections and an intermediate portion of the base so that the housing in an upright position is adapted to be disposed in the first receiving space and clamped by the vertical sections; and the L-shaped members are further adapted to pivot about 180 degrees with respect to the recesses with the horizontal sections being flush with the base and extended from the mouths of the recesses, and each vertical section being upright from a portion thereof joined the horizontal section for defining a second receiving space by the parallel vertical sections, the base, and the horizontal sections so that the housing in a lain position is adapted to be disposed in the second receiving space and clamped by the vertical sections.

2. The support of claim 1, further comprising a cavity at either end of the joining portion of the horizontal section and the vertical section and a mated projection at either side of the recess.

3. The support of claim 1, further comprising a projection at either end of the joining portion of the horizontal section and the vertical section and a mated cavity at either side of the recess.

4. The support of claim 1, further comprising a U shaped gap at about an intermediate portion of an outer surface of the vertical section, and a flexible member defined by the U-shaped gap, the flexible member having a latch on an inner surface of the vertical section.

5. The support of claim 1, further comprising a catch at about center of an open end of the vertical section distal from the horizontal section, the catch being substantially parallel to the horizontal section, wherein responsive to pivoting the L-shaped members a position with the second receiving space being formed, the lain housing is clamped in the second receiving space and the catches are snapped on the housing for fastening.

6. The support of claim 1, further comprising at least one opening at about center of the base.

7. The support of claim 4, further comprising a plurality of slots at either side of each of a top and a bottom of the housing, the latches being adapted to insert into the slots for securing the housing to the support.

* * * * *